US010297727B2

(12) United States Patent
Stoll et al.

(10) Patent No.: US 10,297,727 B2
(45) Date of Patent: May 21, 2019

(54) CONVERTER MATERIAL, METHOD FOR PRODUCING A CONVERTER MATERIAL, AND OPTOELECTRONIC COMPONENT

(71) Applicant: OSRAM Opto Semiconductors GmbH, Regensburg (DE)

(72) Inventors: Ion Stoll, Tegernheim (DE); Britta Göötz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/441,154

(22) PCT Filed: Nov. 4, 2013

(86) PCT No.: PCT/EP2013/072941

§ 371 (c)(1),
(2) Date: May 7, 2015

(87) PCT Pub. No.: WO2014/072255

PCT Pub. Date: May 15, 2014

(65) Prior Publication Data

US 2015/0255688 A1 Sep. 10, 2015

(30) Foreign Application Priority Data

Nov. 7, 2012 (DE) ........................ 10 2012 110 668

(51) Int. Cl.
*G02B 1/10* (2015.01)
*C09K 11/02* (2006.01)
(Continued)

(52) U.S. Cl.
CPC ............ *H01L 33/502* (2013.01); *C09K 11/02* (2013.01); *C09K 11/025* (2013.01); *C09K 11/08* (2013.01);
(Continued)

(58) Field of Classification Search
CPC ..... H01L 33/502; H01L 33/507; H01L 33/56; H01L 33/501; H01L 2224/48091;
(Continued)

(56) References Cited

U.S. PATENT DOCUMENTS

2004/0159849 A1* 8/2004 Negley ................. H01L 33/501 257/98
2006/0040103 A1* 2/2006 Whiteford ............. B82Y 30/00 428/403
2006/0083694 A1* 4/2006 Kodas ................. B01J 13/0043 424/46
2008/0012031 A1* 1/2008 Jang ....................... C09K 11/02 257/89
2008/0179567 A1* 7/2008 Comanzo ............ C09K 11/665 252/301.6 R (Continued)

FOREIGN PATENT DOCUMENTS

DE 102006008879 A1 8/2007
DE 102010042217 A1 4/2012
DE 102011113962 A1 3/2013

OTHER PUBLICATIONS

Dang, C., et al., "A Wafer-Level Integrated White-Light-Emitting Diode Incorporating Colloidal Quantum Dots as a Nanocomposite Luminescent Material," Advanced Materials, vol. 24, Issue 44, Nov. 20, 2012, 4 pages.

(Continued)

*Primary Examiner* — Nishath Yasmeen
(74) *Attorney, Agent, or Firm* — Slater Matsil, LLP

(57) ABSTRACT

A converter material includes a porous inorganic matrix material having a multiplicity of pores. A multiplicity of inorganic nanoparticles are applied on the surface of the matrix material. The nanoparticles are suitable for converting electromagnetic radiation in a first wavelength range into electromagnetic radiation in a second wavelength range. A method for producing such a converter material and an
(Continued)

5
1
3
4
1'
3
1
4
3
1' optoelectronic component that includes such a converter material are furthermore specified.

17 Claims, 5 Drawing Sheets

(51) Int. Cl.

| | |
|---|---|
| ***C09K 11/08*** | (2006.01) |
| ***C09K 11/56*** | (2006.01) |
| ***C09K 11/88*** | (2006.01) |
| ***H01L 33/50*** | (2010.01) |
| ***H01L 33/56*** | (2010.01) |

(52) U.S. Cl.
CPC .......... *C09K 11/565* (2013.01); *C09K 11/883* (2013.01); *G02B 1/10* (2013.01); *H01L 33/501* (2013.01); *H01L 33/507* (2013.01); *H01L 33/56* (2013.01); *H01L 33/504* (2013.01); *H01L 2224/48091* (2013.01); *H01L 2933/0041* (2013.01)

(58) Field of Classification Search
CPC .......... H01L 33/504; H01L 2933/0041; C09K 11/08; C09K 11/025; C09K 11/565; C09K 11/883; C09K 11/02; G02B 1/10
See application file for complete search history.

(56) References Cited

U.S. PATENT DOCUMENTS

| | | | | |
|---|---|---|---|---|
| 2009/0020897 | A1 | 1/2009 | Winkler et al. | |
| 2009/0261366 | A1 | 10/2009 | Eisert et al. | |
| 2010/0224831 | A1* | 9/2010 | Woo | C09K 11/02 252/301.6 S |
| 2011/0068322 | A1* | 3/2011 | Pickett | C09K 11/02 257/13 |
| 2012/0181919 | A1* | 7/2012 | Wei | C09K 11/02 313/503 |
| 2013/0207151 | A1 | 8/2013 | Eberhardt et al. | |

OTHER PUBLICATIONS

"Core/Shell Semiconductor Nanocrystals," Wikipedia, Sep. 22, 2012, http://en.wikipedia.org/w/index.php?title=Core/Shell_Semiconductor_Nanocrystals&oldid=514075582, 6 pages.

* cited by examiner

CONVERTER MATERIAL, METHOD FOR PRODUCING A CONVERTER MATERIAL, AND OPTOELECTRONIC COMPONENT

This patent application is a national phase filing under section 371 of PCT/EP2013/072941, filed Nov. 4, 2013, which claims the priority of German patent application 10 2012 110 668.1, filed Nov. 7, 2012, each of which is incorporated herein by reference in its entirety.

TECHNICAL FIELD

A converter material, a method for producing a converter material, and an optoelectronic component comprising a converter material are specified.

BACKGROUND

Converter materials are described, for example, in the following documents: DE 10 2011 113 962, C. Dang et al., "A wafer-level integrated white light emitting diode incorporating colloidal quantum dots as a nanocomposite luminescent material", Advanced Materials, 2012, published online (DOI: 10.1002/adma.201202354).

SUMMARY

Embodiments of the invention specify a converter material comprising inorganic light-converting nanoparticles whose conversion efficiency exhibits a low dependence on temperature. Further embodiments specify a method for producing such a converter material and an optoelectronic component comprising such a converter material.

A converter material comprises a porous inorganic matrix material having a multiplicity of pores. A multiplicity of inorganic nanoparticles is applied on the surfaces of the pores. The nanoparticles preferably impart wavelength-converting properties to the converter material. In other words, the nanoparticles are preferably suitable for converting electromagnetic radiation in the first wavelength range into electromagnetic radiation in the second wavelength range. The inorganic matrix material is particularly preferably free of wavelength-converting properties.

It goes without saying that the converter material can comprise not just a single type of nanoparticles, rather that a plurality of mutually different types of nanoparticles can be introduced into the pores of the inorganic matrix material.

Particularly preferably, the inorganic nanoparticles are applied to the surface of the inorganic matrix material in direct contact. In other words, the nanoparticles are particularly preferably in direct contact with the inorganic matrix material. In this way, the dissipation of heat from the nanoparticles during the use of the converter material is advantageously improved compared with nanoparticles in a resin. The improved dissipation of heat from the nanoparticles advantageously results in an increased stable conversion efficiency.

The arrangement of the nanoparticles in the pores of the inorganic matrix material furthermore advantageously makes it possible predominantly to prevent the aggregation of the nanoparticles among one another, such as generally takes place with the use of pure nanoparticles.

The pores of the inorganic matrix material are generally cavities in the inorganic matrix material. The cavities can be embodied in an ordered or disordered manner in the inorganic matrix material.

In accordance with one embodiment of the converter material, the pores of the inorganic matrix material have an average diameter of between 2 nanometers and 50 nanometers inclusive. Such inorganic materials are also designated as mesoporous inorganic materials.

The average diameter of the pores of the inorganic matrix material can be determined by one of the following methods, for example: water porosymmetry, mercury porosymmetry, gas adsorption or optical methods, such as, for example, determination by means of a microscope.

The inorganic matrix material is characterized, for example, by its total porosity, inter alia. The total porosity is the ratio of the volume of the pores to the total volume of the inorganic matrix material. In this case, the total porosity of the inorganic matrix material is composed of the open porosity and the closed porosity. In this case, the open porosity denotes the ratio between the volume of the pores that are in contact among one another and with the medium surrounding the matrix material to the total volume of the inorganic matrix material. By contrast, the closed porosity denotes the ratio of the volume of the isolated pores of the inorganic matrix material to the total volume of the inorganic matrix material.

The inorganic matrix material preferably has an open porosity of between 0.05 and 0.75 inclusive. Particularly preferably, the inorganic matrix material has an open porosity of between 0.1 and 0.3 inclusive.

In accordance with a further embodiment of the converter material, the pores of the inorganic matrix material have an average diameter of between 50 nanometers and 1000 nanometers inclusive. Such inorganic materials are also designated as mesoporous inorganic materials.

The inorganic matrix material can comprise, for example, an oxide of one of the following materials or an oxide of a mixture of the following materials: silicon, aluminum, tantalum, titanium, zirconium, cerium, tin, niobium. It is also possible for the inorganic matrix material to consist of an oxide of said materials or of an oxide of a mixture of said materials.

The inorganic nanoparticles can, for example, comprise one of the following materials or consist of one of the following materials: zinc sulfide, cadmium sulfide, zinc selenide, zinc oxide, cadmium selenide, cadmium oxide, indium phosphide, copper indium sulfide, lead sulfide.

The inorganic nanoparticles have, for example, a diameter of between 1 nanometer and 50 nanometers inclusive. Particularly preferably, the inorganic nanoparticles have a diameter of between 2 nanometers and 10 nanometers inclusive.

Furthermore, each nanoparticle can have an organic outer shell, which generally forms the outer surface of the nanoparticle. The outer shell comprises an organic material, for example, which is phosphate- or sulfide-based. The organic outer shell is provided for at least reducing agglomeration of the nanoparticles. The abovementioned values for the diameter of the nanoparticles are understood as values for the diameter without the organic outer shell.

Furthermore, the inorganic nanoparticles can also be core-shell nanoparticles. Core-shell nanoparticles generally have a core surrounded by a shell. In this case, the core and the shell are generally formed from two different materials. The core is preferably formed from a semiconductor material, for example, a III-V semiconductor material such as indium phosphide. The core generally has wavelength-converting properties, that is to say that the core is generally suitable for converting electromagnetic radiation in the first wavelength range into electromagnetic radiation in the second wavelength range.

The shell of the core-shell nanoparticles can, for example, likewise comprise a semiconductor material, in particular a III-V semiconductor material, or consist of such a material. By way of example, one of the following materials is suitable for the shell: zinc sulfide, zinc selenide, zinc oxide.

Particularly preferably, the nanoparticles are arranged in each case in a manner spaced apart from one another on the surface of the pores. In other words, between the nanoparticles a partial region of the surface of the pores in each case is exposed and is not covered with nanoparticles. It should be pointed out at this juncture that generally it is only technically feasible for the largest possible portion of the nanoparticles to be arranged in a manner spaced apart from one another on the surface of the pores, while a very small portion of the nanoparticles are in direct contact with one another. Particularly preferably, at least 95% of the nanoparticles are arranged in a manner spaced apart from one another on the surface of the pores.

The spaced-apart arrangement of the nanoparticles on the surface of the pores makes it possible at least to reduce in particular a reduction of the conversion efficiency of the nanoparticles on account of concentration quenching of the nanoparticles among one another.

In accordance with a further embodiment of the converter material, a further multiplicity of nanoparticles are applied on the surface of the pores and are suitable for converting electromagnetic radiation in the first wavelength range into electromagnetic radiation in a third wavelength range. In other words, the inorganic matrix material is loaded with a further multiplicity of nanoparticles, the wavelength-converting properties of which differ from the wavelength-converting properties of the other multiplicity of nanoparticles. By way of example, the initial nanoparticles are suitable for converting blue light in the first wavelength range into green light in the second wavelength range, while the further nanoparticles are suitable for converting blue light in the first wavelength range into red light in the third wavelength range.

The first wavelength range, the second wavelength range and the third wavelength range particularly preferably differ from one another, partial overlapping of the wavelength ranges not being excluded here.

The first wavelength range can, for example, comprise blue light or be formed from blue light. The second wavelength range can, for example, comprise yellow light or be formed from yellow light. Particularly if the converter material comprises two different types of nanoparticles, then the second wavelength range particularly preferably comprises green light or is formed from green light and the third wavelength range particularly preferably comprises red light or is formed from red light. In this way, it is possible to produce a converter material which emits white light upon excitation with the blue light emitted, for example, by a semiconductor body.

In accordance with one embodiment of the converter material, the nanoparticles are arranged only on the surface of the pores, while a volume region of the pores is free of the nanoparticles. By way of example, the volume region of the pores is filled with air.

The converter material can be present, for example, as a multiplicity of converter particles. The converter particles have, for example, a diameter of between 1 micrometer and 50 micrometers inclusive. Furthermore, it is also possible for the converter particles to have a diameter of between 20 nanometers and 1000 nanometers inclusive. Converter particles having a diameter of between 20 nanometers and 1000 nanometers inclusive advantageously exhibit in particular low scattering of light.

If the converter material is present in the form of converter particles, then this has the advantage that the converter material can be processed further by means of one of the following methods: potting, printing, electrophoretic deposition, spraycoating, molding, sol-gel process.

In the case of potting, printing, spraycoating and molding, the converter particles generally are firstly introduced into a resin, such as a silicone, an epoxy or a mixture of these materials, and then processed further. Besides the resin and the converter particles, the mixture can contain further substances that are generally coordinated with the method respectively used for further processing.

In the case of potting, the mixture of resin and converter particles is generally positioned around a semiconductor body and then cured. By way of example, the semiconductor body is arranged in a cavity filled with the mixture of resin and converter particles.

The mixture of resin and converter particles can also be processed further by printing, in particular by screen printing. In the case of screen printing, the mixture of resin and converter particles is generally applied to a film with the aid of a screen in a desired shape, for example, in the shape of the radiation exit surface of a semiconductor body. Afterward, the resin is cured, such that a resin-based converter plate arises. The finished resin-based converter plate can be applied on the radiation exit surface of a semiconductor body, for example, by means of a pick-and-place method.

In the case of the "spraycoating" method, the mixture comprising the resin and the converter particles generally furthermore comprises an organic solvent. This mixture is applied by spraying on a desired surface, for example, on a radiation exit surface of a semiconductor body.

In the case of the "molding" method, the mixture comprising the resin and the converter particles is brought to the desired shape with the aid of a mold.

In the case of electrophoretic deposition, the converter particles are introduced into an electrophoresis bath. The converter particles carry electrical charges on their surface in the electrophoresis bath. The surface on which the converter particles are intended to be deposited is also provided in the electrophoresis bath.

Afterward, the converter particles are accelerated by an electrical voltage being applied to the electrophoresis bath in such a way that they deposit on the surface to be coated. In general, the surface on which the converter particles are deposited in this case forms an electrode via which the voltage is applied to the electrophoresis bath. During the duration of the electrophoretic deposition, that is to say during the time when the voltage is applied to the electrophoresis bath, more and more converter particles deposit on the surface to be coated. In general, the converter particles deposited in a layer are fixed with the aid of a binder, for example, an organic resin.

For further processing by means of a sol-gel process, the converter particles are generally introduced into a sol, from which a gel arises as a result of aging. The gel is generally processed further by sintering to form a ceramic or a glass.

Furthermore, the converter material can also be embodied as a planar plate, as a domed plate or as a plate having a free surface of arbitrary shape. An edge length of the planar plate, of the domed plate or of the plate having a free surface of arbitrary shape is particularly preferably between 50 micrometers and 10 centimeters inclusive.

Such a converter material particularly preferably comprises an inorganic matrix material which is embodied as a planar plate, as a domed plate or as a plate according to a free surface of arbitrary shape and the pore surfaces of which are loaded, that is to say partly covered, with the nanoparticles.

A converter material embodied as a plate, independently of whether the plate is embodied in a planar fashion, in a domed fashion or according to a free surface of arbitrary shape, preferably has a thickness of between 10 micrometers and 1 millimeter inclusive. Particularly preferably, such a converter material has a thickness of between 50 micrometers and 200 micrometers inclusive.

A converter material embodied as a planar plate can be provided, for example, for being applied to the radiation exit surface of a semiconductor body that emits electromagnetic radiation in the first wavelength range. In this case, it is generally expedient if a main surface of the planar plate has the same shape as, or a similar shape to, the radiation exit surface of the semiconductor body. By way of example, the main surface of the planar plate is embodied in a rectangular or square fashion. Furthermore, the main surface of the planar plate can be embodied as a rectangle or as a square, wherein a cutout is provided for a bonding pad of the semiconductor body. The cutout for the bonding pad in this case is preferably arranged in a corner of the rectangle or square.

A converter material embodied as a domed plate particularly preferably has a domed shape having a round basic surface, for example, a circle, an ellipse or an oval. By way of example, the side length of a rectangle or square on which the basic surface is inscribed can be designated as the edge length of such a converter material.

The domed converter material is furthermore preferably embodied as rotationally symmetrical with respect to a rotation axis. That axial section on the rotation axis which corresponds to the height of the dome can also be designated as the edge length of such a conversion material.

A converter material having a main surface corresponding to a free surface of arbitrary shape is also preferably embodied as rotationally symmetrical with respect to a rotation axis. Furthermore, it is additionally or alternatively also possible for a basic surface of the converter material in the form of the free surface to be embodied as point-symmetrical.

The term "edge length" of a converter material present as a plate having a free surface of arbitrary shape can denote, for example, the side length of a rectangle or square into which the basic surface is inscribed. Furthermore, that section on a rotation axis which corresponds to the height of the free surface can also be designated as the edge length of the conversion material.

A method for producing a converter material preferably comprises the following steps:

providing a porous inorganic matrix material having a multiplicity of pores, introducing a multiplicity of nanoparticles into the pores, and adsorbing the nanoparticles on a surface of the pores.

By way of example, the nanoparticles can be adsorbed from a solvent on the surface of the pores. For this purpose, preferably, a suspension of the nanoparticles in the solvent is first formed. Besides the nanoparticles and the solvent, the suspension can also contain even further substances, such as auxiliaries, for example, which reduce the aggregation of the nanoparticles in the solvent. In a next step, the inorganic matrix material is introduced into the suspension. By way of example, the inorganic matrix material is bathed in the suspension. In this case, the solvent with the inorganic nanoparticles particularly preferably fills the pores of the inorganic matrix material as completely as possible. In this case, the nanoparticles in the solvent generally adsorb on the surface of the pores over the course of time. After the nanoparticles have adsorbed on the surface of the pores, the solvent is removed again from the pores, for example, by means of a drying process. Furthermore, it is also possible for the nanoparticles to adsorb on the surface of the pores during the drying process.

Introducing the nanoparticles into the porous matrix material via the solvent generally makes it possible advantageously to prevent aggregation of the nanoparticles. Particularly preferably, the nanoparticles are present in a manner diluted in the solvent and fill the cavities of the inorganic matrix material uniformly together with the solvent molecules. The solvent molecules surrounding the nanoparticles thus prevent aggregation of the nanoparticles among one another. Furthermore, with a comparatively low concentration of nanoparticles in the solvent, it is generally possible to obtain a spaced-apart arrangement of the nanoparticles on the surface of the pores of the finished converter material.

Preferably, the nanoparticles in the solvent have a concentration that is not greater than 150 mg/ml. Particularly preferably, the nanoparticles in the solvent have a concentration that is not greater than 10 mg/ml.

By way of example, one of the following substances can be used as the solvent: toluene, xylene, pentane.

An optoelectronic component comprises a semiconductor body, which emits electromagnetic radiation in a first wavelength range from a radiation exit surface. The component also comprises a converter material suitable for converting the radiation in the first wavelength range that is emitted by the semiconductor body at least partly into electromagnetic radiation in the second wavelength range.

In particular, the converter material already described here is suitable for being used in combination with a semiconductor body, wherein the semiconductor body is used to emit blue light. This has the advantage that the nanoparticles which bring about the conversion of the incident electromagnetic radiation in the first wavelength range into electromagnetic radiation in at least one different wavelength range have a continuous absorption spectrum in the blue spectral range. This advantageously has the consequence that during the production of a multiplicity of components there is no need to carry out color locus control of the optoelectronic component on account of deviating emission spectra of the semiconductor bodies.

It goes without saying that the optoelectronic component can comprise not just a single type of converter material, rather that the optoelectronic component can comprise a plurality of different converter materials.

The converter material is situated particularly preferably in the beam path of the semiconductor body. In other words, the converter material is preferably disposed downstream of the semiconductor body in the emission direction thereof.

In accordance with one embodiment, the converter material is arranged in direct contact with the semiconductor body, particularly preferably in direct contact with the radiation exit surface of the semiconductor body. By way of example, the converter material can be applied in the form of a layer directly to the radiation exit surface.

In accordance with a further embodiment, the converter material is arranged in a manner spatially at a distance from the semiconductor body (remote phosphor configuration). By way of example, the converter material can be embodied as a planar plate, as a domed plate or as a plate having a free surface of arbitrary shape and can be arranged in a manner spaced apart from the semiconductor body in the beam path of the semiconductor body.

BRIEF DESCRIPTION OF THE DRAWINGS

Further advantageous embodiments and developments of the invention will become apparent from the exemplary embodiments described below in association with the figures.

With reference to the schematic illustrations in FIGS. 1 to 4, a description is given of one exemplary embodiment of a method for producing a converter material.

Elements that are identical, of identical type of act identically are provided with the same reference signs in the figures. The figures and the size relationships of the elements illustrated in the figures among one another should not be regarded as to scale. Rather, individual elements, in particular layer thicknesses, may be illustrated with an exaggerated size in order to enable better illustration and/or in order to afford a better understanding.

DETAILED DESCRIPTION OF ILLUSTRATIVE EMBODIMENTS

Figure 1:
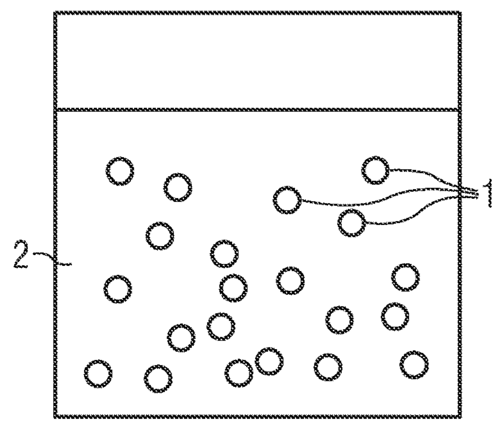

In the case of the method in accordance with the exemplary embodiment in FIGS. 1 to 4, a first step involves providing a multiplicity of inorganic nanoparticles 1 in a solvent 2, wherein the nanoparticles 1 are suitable for converting electromagnetic radiation in a first wavelength range into electromagnetic radiation in a second wavelength range (FIG. 1).

The nanoparticles 1 and the solvent 2 generally form a suspension. In this case, the nanoparticles 1 are suitable for converting electromagnetic radiation in a first wavelength range into electromagnetic radiation in a second wavelength range. The nanoparticles 1 have, for example, a diameter of between 1 nanometer and 50 nanometers inclusive. By way of example, the nanoparticles 1 can comprise one of the following materials or consist of one of the following materials: zinc sulfide, cadmium sulfide, zinc selenide, zinc oxide, cadmium selenide, cadmium oxide, indium phosphide, copper indium sulfide, lead sulfide. Furthermore, the nanoparticles 1 can also be core-shell nanoparticles.

By way of example, toluene, xylene or pentane is suitable as the solvent 2. The nanoparticles 1 are particularly preferably contained in the solvent 2 in a diluted fashion. Particularly preferably, the nanoparticles 1 in the solvent 2 have a concentration that is not greater than 10 mg/ml.

Furthermore, a porous inorganic matrix material 3 having a multiplicity of pores 4 is provided. In the present exemplary embodiment, the inorganic matrix material 3 is present as particles preferably having a diameter of between 1 micrometer and 50 micrometers inclusive (FIG. 2).

Figure 2:
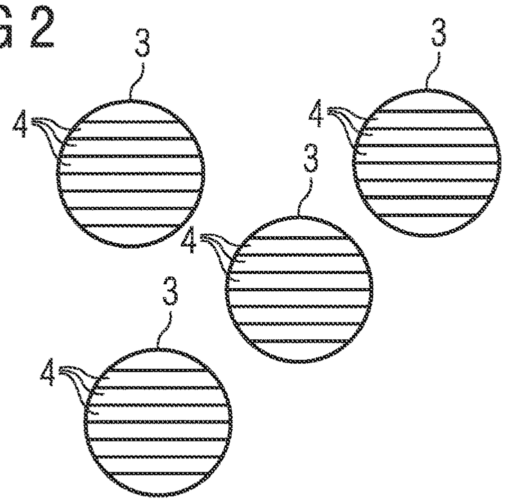
Figure 3:
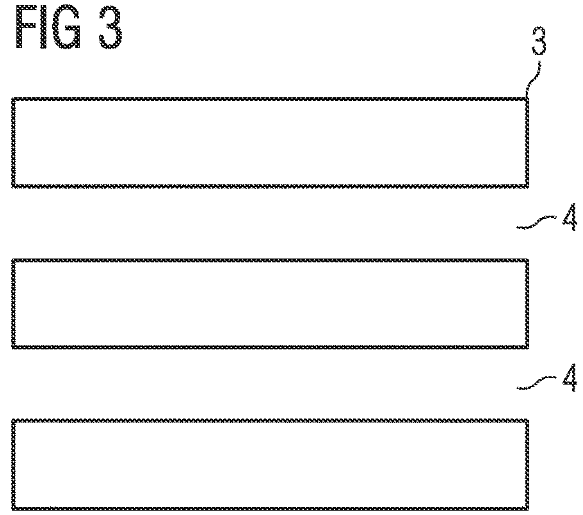

FIG. 3 shows a schematic sectional illustration of an excerpt from one of the particles in FIG. 2, and in particular an enlargement of the pores 4 of the inorganic matrix material 3. The pores 4 of the inorganic matrix material have, for example, an average diameter of between 2 nanometers and 50 nanometers inclusive. Furthermore, an inorganic matrix material 3 is also suitable whose pores 4 are larger and have, for example, an average diameter of between 50 nanometers and 1000 nanometers inclusive (FIG. 3).

Figure 4:
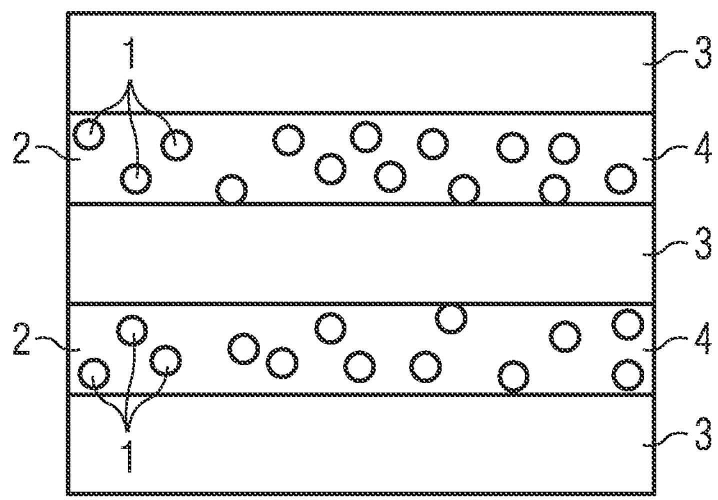

A next step involves introducing the solvent 2 with the nanoparticles 1 in accordance with FIG. 1 into the pores 4 of the inorganic matrix material 3. For this purpose, the particles of the inorganic porous matrix material 3 are bathed, for example, in the suspension with the nanoparticles 1. During the bathing of the particles of the inorganic matrix material 3 in the suspension, both the solvent 2 and the nanoparticles 1 penetrate into the pores 4 (FIG. 4). In this case, the suspension particularly preferably fills the pores 4 of the particles of the inorganic matrix material 3 as completely as possible.

The nanoparticles 1 can now adsorb on a surface of the pores 4. Afterward, the solvent 2 is removed again from the pores 4, for example, by means of a drying process.

Figure 5:
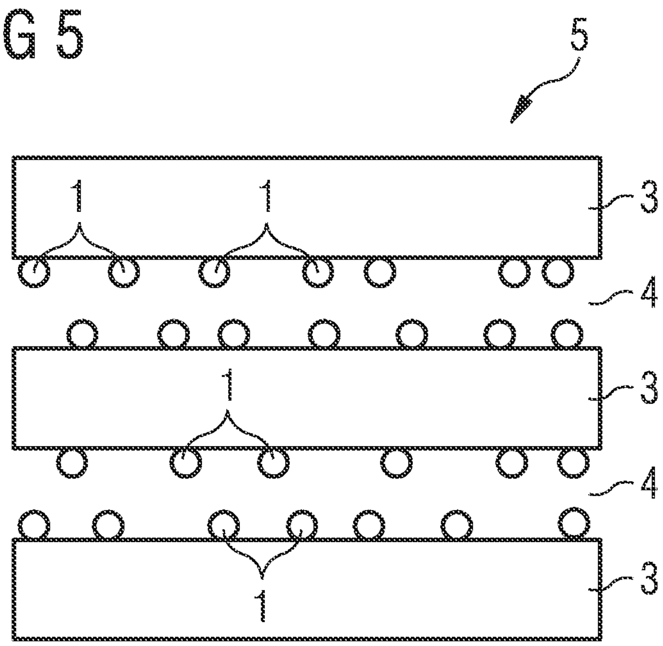
FIGS. 5 and 6 each show a schematic sectional illustration of a converter material in accordance with a respective exemplary embodiment.

FIG. 5 then schematically shows a converter material 5 which arises as the end product of the method in accordance with the exemplary embodiment in FIGS. 1 to 4.

The converter material 5 in accordance with the exemplary embodiment in FIG. 5 is embodied as converter particles and comprises a porous inorganic matrix material 3. A multiplicity of inorganic nanoparticles 1 are applied on the surface of the pores 4 of the inorganic matrix material 3 and are suitable for converting electromagnetic radiation in a first wavelength range into electromagnetic radiation in a second wavelength range. The nanoparticles 1 are arranged only on the surface of the pores 4, while a volume region of the pores 4 is free from the nanoparticles 1. By way of example, the volume region of the pores 4 is filled with air.

In this case, the nanoparticles 1 are applied in a manner spaced apart from one another on the surface of the pores 4. In other words, the nanoparticles 1 are predominantly not in direct contact with one another.

Figure 6:
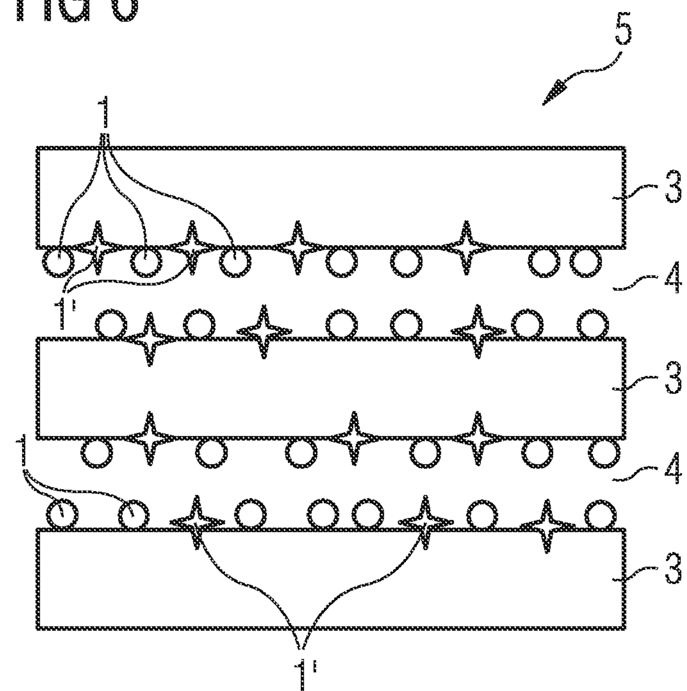

In the case of the converter material 5 in accordance with the exemplary embodiment in FIG. 6, in contrast to the converter material 5 in accordance with the exemplary embodiment in FIG. 5, a further multiplicity of nanoparticles 1' are applied on the surface of the pores 4 of the inorganic matrix material 3. In this exemplary embodiment, too, the nanoparticles 1, 1' are only arranged on the surface of the pores 4, while a volume region is free of nanoparticles 1, 1'.

The further multiplicity of nanoparticles 1' is suitable for converting electromagnetic radiation in the first wavelength range into electromagnetic radiation in a third wavelength range. In this case, the first, second and third wavelength ranges differ from one another.

The first wavelength range particularly preferably comprises blue light or is formed from blue light; the second wavelength range particularly preferably comprises green light or is formed from green light. The third wavelength range particularly preferably comprises red light or is formed from red light.

In particular, the converter material 5 in accordance with the exemplary embodiment in FIG. 6 is suitable for converting blue light emitted by a semiconductor body (not illustrated) partly into green light and partly into red light, while a further part of the blue light passes through the converter material 5 without being converted. Such a converter material 5 is suitable, in particular, for generating white light in conjunction with a semiconductor body that emits blue light.

Figure 7:
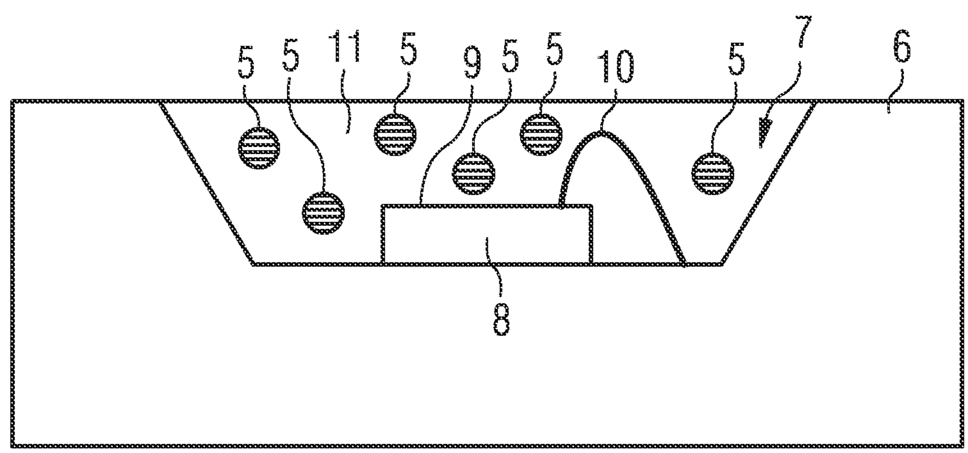
FIGS. 7 to 11 show schematic sectional illustrations of an optoelectronic component in accordance with various exemplary embodiments.

The optoelectronic component in accordance with the exemplary embodiment in FIG. 7 comprises a component housing 6 having a recess 7. A semiconductor body 8 is mounted onto a base of the recess 7, said semiconductor body being suitable for emitting blue light from a radiation exit surface 9 during operation. The semiconductor body 8 is furthermore electrically conductively contacted with a bonding wire 10 on the front side.

The recess 7 of the component housing 6 is filled with a potting 11. The potting 11 comprises an organic resin, for example, a silicone or an epoxy or a mixture of these two materials, into which particulate converter material 5, such as has already been described with reference to FIGS. 5 and 6, for example, is introduced.

If converter particles 5 comprising one type of nanoparticles 1 are introduced into the potting, as described with reference to FIG. 5, for example, then these are suitable, for example, for partly converting the blue radiation of the semiconductor body 8, which is emitted from the radiation exit surface 9 thereof, into yellow radiation. The optoelectronic component emits mixed-colored white light comprising converted yellow light in the second wavelength range and unconverted blue light in the first wavelength range.

If converter particles 5 comprising two types of nanoparticles 1, 1' are contained in the potting 11, as described with reference to FIG. 6, for example, then one type of nanoparticles 1 is suitable, for example, for partly converting the blue radiation of the semiconductor body 8, which is emitted from the radiation exit surface 9 thereof, into green radiation, while the other type of nanoparticles 1' is suitable for partly converting the blue radiation of the semiconductor body 8 into red radiation. A further part of the blue radiation of the semiconductor body 8 passes through the potting 11 without being converted. The optoelectronic component then emits mixed-colored white light comprising converted green and red light in the second and third wavelength ranges and unconverted blue light in the first wavelength range.

Figure 8:
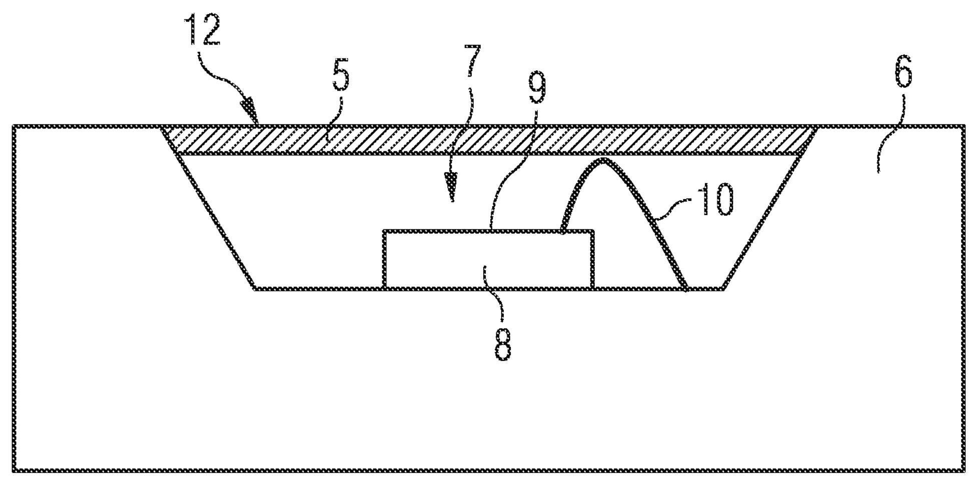

The optoelectronic component in accordance with the exemplary embodiment in FIG. 8 likewise comprises a component housing 6 having a recess 7, onto the base of which a radiation-emitting semiconductor body 8 is mounted. The semiconductor body 8 is once again suitable for emitting electromagnetic radiation in a first wavelength range during operation. Furthermore, the component in accordance with FIG. 8 comprises a converter material 5 suitable for converting radiation in the first wavelength range into radiation in a second wavelength range.

In this case, the converter material 5 is arranged in the beam path of the semiconductor body 8. The radiation of the semiconductor body 8 passes substantially completely through the converter material 5.

Like the converter materials 5 in accordance with FIGS. 5 and 6, the converter material 5 has pores with a multiplicity of nanoparticles 1 (not illustrated) applied on the surface thereof. The nanoparticles 1 impart the wavelength-converting properties to the converter material in the present case. In other words, the nanoparticles 1 are suitable for converting electromagnetic radiation in the first wavelength range into electromagnetic radiation in the second wavelength range.

The converter material 5 is embodied as a planar plate in the present case. The planar plate preferably completely fills an upper opening 12 of the recess 7 of the component housing 6 and closes off the recess 7. The converter plate 5 particularly preferably has a thickness of between 10 micrometers and 1 millimeter inclusive.

The geometrical shape of a main surface of the planar plate 5 is preferably embodied in accordance with the geometrical shape of the opening 12 of the recess 7. By way of example, the opening 12 can be embodied in a rectangular or square fashion. In this case, the converter plate 5 is preferably also embodied in a rectangular or square fashion. A side length of the square or of the rectangle is particularly preferably between 50 micrometers and 10 centimeters inclusive.

Figure 9:
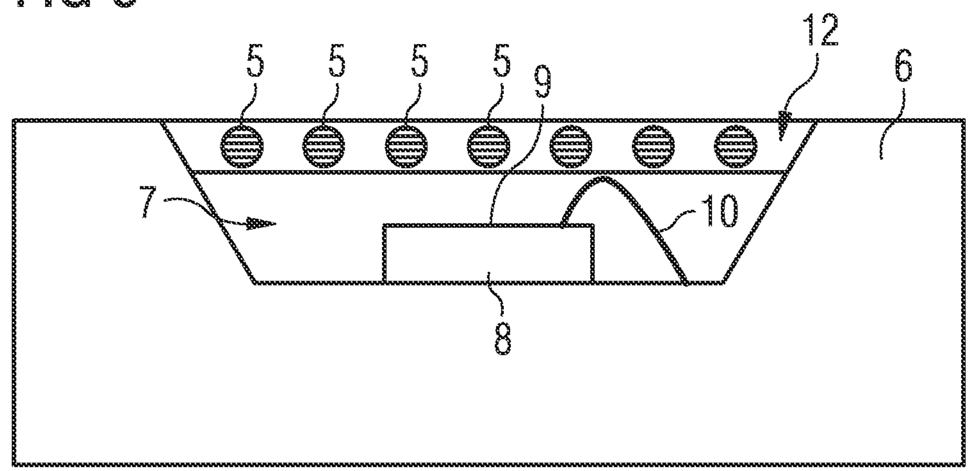

Like the components in accordance with the exemplary embodiments in FIGS. 7 and 8, the component in accordance with the exemplary embodiment in FIG. 9 comprises a component housing 6 having a recess 7, to the base of which a radiation-emitting semiconductor body 8 is applied. The semiconductor body 8 is once again suitable for converting electromagnetic radiation in a first wavelength range into electromagnetic radiation in a second wavelength range.

Furthermore, the optoelectronic component comprises converter particles 5 such as have already been described for example with reference to FIG. 5 or FIG. 6. In this case, the converter particles 5 are introduced into a resin, which is likewise embodied in the form of a planar plate. The resin-based converter plate is arranged in the beam path of the semiconductor body 8.

Figure 10:
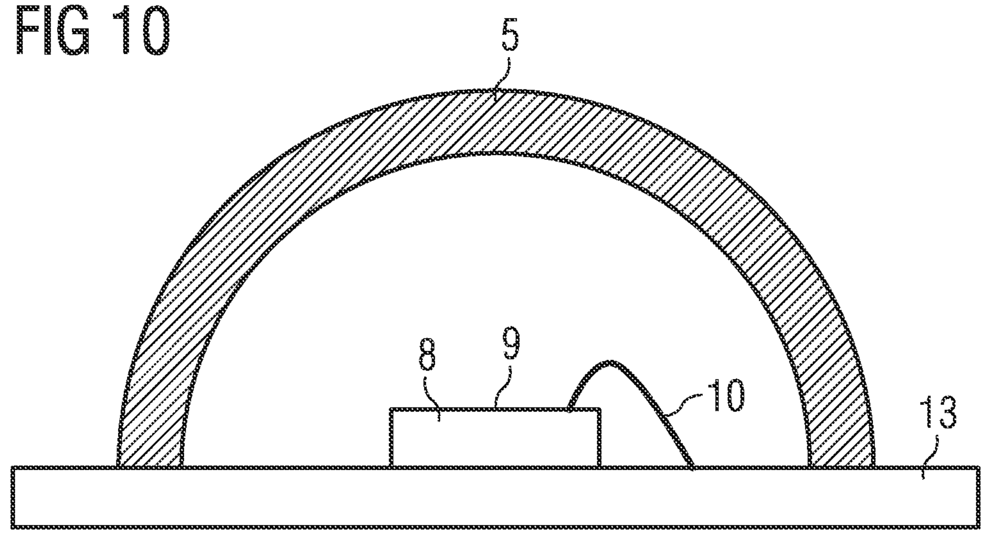

The optoelectronic component in accordance with the exemplary embodiment in FIG. 10 comprises a carrier 13, on which a radiation-emitting semiconductor body 8 is applied. The semiconductor body 8 is suitable for emitting electromagnetic radiation in a first wavelength range from its radiation exit surface 9.

Furthermore, the optoelectronic component comprises a domed converter material 5 applied on the carrier 13. In this case, the domed converter material 5 surrounds the semiconductor body 8 and is embodied and positioned in such a way that it is situated at least predominantly in the beam path of the semiconductor body 8.

The domed converter material 5 can comprise, for example, a domed inorganic matrix material 3 with a multiplicity of pores 4. A multiplicity of nanoparticles, 1, 1' are again applied to the surface of the pores 4, as already described with reference to FIGS. 5 and 6, for example.

Figure 11:
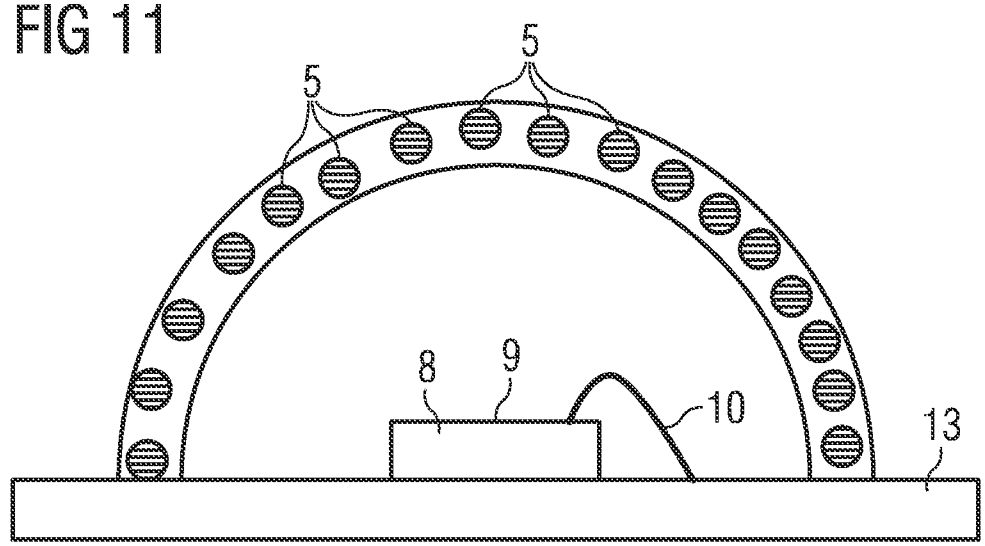

Like the optoelectronic component in accordance with FIG. 10, the optoelectronic component in accordance with the exemplary embodiment in FIG. 11 also comprises a carrier 13, to which a radiation-emitting semiconductor body 8 is applied, and a domed converter element. However, the domed converter element is resin-based, as in the case of the optoelectronic component in accordance with FIG. 9. The domed converter element in the case of the optoelectronic component in accordance with FIG. 11 comprises converter particles 5 such as have already been described in association with FIGS. 5 and 6, for example, which converter particles are introduced into a resin embodied in a domed fashion. Such a converter element can be produced by means of molding, for example.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A converter material comprising:

a porous inorganic matrix material having a plurality of pores, each pore having an interior surface; and a first plurality of inorganic nanoparticles in direct contact with the interior surface within each pore, wherein the first nanoparticles are spaced apart from each other on the interior surface within each pore, and wherein the first nanoparticles are suitable for converting electromagnetic radiation in a first wavelength range to electromagnetic radiation in a second wavelength range.

2. The converter material according to claim 1, wherein the pores have an average diameter of between 2 nanometers and 50 nanometers inclusive.

3. The converter material according to claim 1, wherein the first nanoparticles have a diameter of between 1 nanometer and 50 nanometers inclusive.

4. The converter material according to claim 1, further comprising a second plurality of nanoparticles in direct contact with the interior surface within each pore, and wherein the second nanoparticles are suitable for converting the electromagnetic radiation in the first wavelength range to electromagnetic radiation in a third wavelength range.

5. The converter material according to claim 1, wherein the converter material forms a plurality of converter particles.

6. The converter material according to claim 5, wherein the converter particles have a diameter of between 1 micrometer and 50 micrometers inclusive.

7. The converter material according to claim 5, wherein the converter particles have a diameter of between 20 nanometers and woo nanometers inclusive.

8. The converter material according to claim 1, wherein the converter material is shaped as a planar plate or as a domed plate.

9. The converter material according to claim 1, wherein the porous inorganic matrix material comprises an oxide of one of the following materials or of a mixture of the following materials: silicon, aluminum, tantalum, titanium, zirconium, cerium, tin, or niobium.

10. The converter material according to claim 1, wherein the first nanoparticles comprise one of the following materials: zinc sulfide, cadmium sulfide, zinc selenide, zinc oxide, cadmium selenide, cadmium oxide, indium phosphide, copper indium sulfide, or lead sulfide.

11. The converter material according to claim 1, wherein the first nanoparticles are core-shell nanoparticles.

12. The converter material according to claim 1, wherein the first nanoparticles are arranged only on the interior surface within each pore, while a volume region inside each pore is free of the first nanoparticles.

13. The converter material according to claim 1, wherein the converter material forms a plurality of converter particles; and wherein the first nanoparticles are arranged only on the interior surface within each pore, while a volume region inside each pore is free of the first nanoparticles.

14. An optoelectronic component comprising:

a semiconductor body configured to emit electromagnetic radiation in a first wavelength range from a radiation exit surface during operation; and a converter material adjacent to the radiation exit surface of the semiconductor body, wherein the converter material comprises a porous inorganic matrix material having a plurality of pores, wherein a plurality of inorganic nanoparticles are in direct contact with an interior surface within each pore, wherein the nanoparticles are spaced apart from each other on the interior surface within each pore, and wherein the nanoparticles are suitable for converting the electromagnetic radiation in the first wavelength range to electromagnetic radiation in a second wavelength range.

15. The optoelectronic component according to claim 14, wherein the converter material is present as converter particles in a potting.

16. A converter material comprising:

a porous inorganic matrix material having a plurality of pores; and a plurality of inorganic nanoparticles suitable for converting electromagnetic radiation in a first wavelength range into electromagnetic radiation in a second wavelength range, wherein the nanoparticles are located only on an interior surface within each pore, such that the nanoparticles are spaced apart from each other and in direct contact with the interior surface within the pore, while a volume region inside each pore is free of the nanoparticles, wherein the matrix material has an open porosity of between 0.05 and 0.75, inclusive, and wherein the nanoparticles have an outer shell comprising an organic material.

17. The converter material according to claim 1, wherein the first nanoparticles are distributed randomly through the porous inorganic matrix material.

* * * * *

UNITED STATES PATENT AND TRADEMARK OFFICE

CERTIFICATE OF CORRECTION

PATENT NO. : 10,297,727 B2
APPLICATION NO. : 14/441154
DATED : May 21, 2019
INVENTOR(S) : Ion Stoll et al.

It is certified that error appears in the above-identified patent and that said Letters Patent is hereby corrected as shown below:

In the Claims

In Column 11, Line 25, Claim 7, delete “woo nanometers inclusive” and insert --1000 nanometers inclusive--.

Signed and Sealed this
Sixteenth Day of July, 2019

Andrei Iancu
*Director of the United States Patent and Trademark Office*